United States Patent
Wang et al.

(10) Patent No.: US 8,106,724 B1
(45) Date of Patent: Jan. 31, 2012

(54) THIN-FILM BULK ACOUSTIC RESONATORS HAVING PERFORATED RESONATOR BODY SUPPORTS THAT ENHANCE QUALITY FACTOR

(75) Inventors: Ye Wang, Cupertino, CA (US); Seungbae Lee, Los Gatos, CA (US); Harmeet Bhugra, San Jose, CA (US)

(73) Assignee: Integrated Device Technologies, inc., San Jose, CA (US)

( * ) Notice: Subject to any disclaimer, the term of this patent is extended or adjusted under 35 U.S.C. 154(b) by 307 days.

(21) Appl. No.: 12/508,257

(22) Filed: Jul. 23, 2009

(51) Int. Cl.
  *H03H 9/00* (2006.01)
  *H01L 41/08* (2006.01)
(52) U.S. Cl. .......... 333/186; 333/189; 310/367
(58) Field of Classification Search .......... 333/186, 333/187, 188, 189, 197, 198; 310/367
  See application file for complete search history.

(56) References Cited

U.S. PATENT DOCUMENTS

| | | | |
|---|---|---|---|
| 4,350,918 A * | 9/1982 | Sato .............. | 310/367 |
| 5,160,901 A | 11/1992 | Stone | |
| 5,229,735 A | 7/1993 | Quan | |
| 5,640,133 A | 6/1997 | MacDonald et al. | |
| 6,557,419 B1 | 5/2003 | Herb et al. | |
| 6,604,266 B1 | 8/2003 | Tajima et al. | |
| 6,657,363 B1 | 12/2003 | Aigner | |
| 6,717,336 B2 * | 4/2004 | Kawashima ........... | 310/367 |
| 6,739,190 B2 | 5/2004 | Hsu et al. | |
| 7,199,504 B2 | 4/2007 | Komuro et al. | |
| 7,202,761 B2 | 4/2007 | Lutz et al. | |
| 7,280,007 B2 | 10/2007 | Feng et al. | |
| 7,312,674 B2 | 12/2007 | Duwel et al. | |
| 7,446,620 B2 | 11/2008 | Partridge et al. | |
| 7,489,063 B2 | 2/2009 | Isobe et al. | |
| 7,608,980 B2 | 10/2009 | Kataoka | |
| 7,616,077 B1 | 11/2009 | Wittwer et al. | |
| 7,639,104 B1 | 12/2009 | Quevy et al. | |
| 7,675,389 B2 | 3/2010 | Yamakawa et al. | |
| 7,907,035 B2 * | 3/2011 | Lutz et al. ............. | 333/186 |

(Continued)

FOREIGN PATENT DOCUMENTS

EP  1 217 735 A1  6/2002

(Continued)

OTHER PUBLICATIONS

"Film Bulk Acoustic-Wave Resonator (FBAR)," Admitted Prior Art, http://mems.usc.edu/fbar.htm, Printed from the Internet Oct. 14, 2008, 3 pages.

(Continued)

*Primary Examiner* — Dean O Takaoka
(74) *Attorney, Agent, or Firm* — Myers, Bigel, et al.

(57) ABSTRACT

Micro-electromechanical acoustic resonators include a substrate having a cavity therein and a resonator body suspended over the cavity. The resonator body is anchored on opposing sides thereof (by support beams) to first and second portions of the substrate. These first and second portions of the substrate, which extend over the cavity as first and second ledges, respectively, each have at least one perforation therein disposed over the cavity. These perforations may be open or filled. The first and second ledges are formed of a first material (e.g., silicon) and the first and second ledges are filled with a second material having a relatively high acoustic impedance relative to the first material. This second material may include a material selected from a group consisting of tungsten (W), copper (Cu), molybdenum (Mo).

9 Claims, 7 Drawing Sheets

U.S. PATENT DOCUMENTS

| | | | |
|---|---|---|---|
| 2002/0096967 | A1 | 7/2002 | Ma et al. |
| 2005/0146248 | A1 | 7/2005 | Moler et al. |
| 2005/0242904 | A1 | 11/2005 | Lutz et al. |
| 2006/0125576 | A1 | 6/2006 | Ho et al. |
| 2006/0196273 | A1 | 9/2006 | Burns |
| 2006/0225504 | A1 | 10/2006 | Ayazi et al. |
| 2007/0069612 | A1 | 3/2007 | Sato |
| 2007/0220971 | A1 | 9/2007 | Ayazi et al. |
| 2007/0277620 | A1 | 12/2007 | Melamud et al. |
| 2008/0143217 | A1 | 6/2008 | Ho et al. |
| 2008/0186109 | A1 | 8/2008 | Ho et al. |
| 2009/0153267 | A1 | 6/2009 | Lutz et al. |
| 2009/0160581 | A1 | 6/2009 | Hagelin et al. |
| 2010/0032789 | A1 | 2/2010 | Schoen et al. |

FOREIGN PATENT DOCUMENTS

| | | |
|---|---|---|
| EP | 2 144 369 A1 | 1/2010 |
| WO | WO 2007/072409 A2 | 6/2007 |

OTHER PUBLICATIONS

"Finite element method," Admitted Prior Art, http://en.wikipedia.org/wiki/Finite_element_method, Printed from the Internet Oct. 28, 2008, 7 pages.

Abdolvand et al., "A Low-Voltage Temperature-Stable Micromechanical Piezoelectric Oscillator," Transducers & Eurosensors '97, The 14th International Conference on Solid-State Sensors, Actuators and Microsystems, Lyon, France, Jun. 10-14, 2007, 4 pages.

Abdolvand et al., "A Temperature-Compensated ZnO-on-Diamond Resonant Mass Sensor," *Proc. 5th IEEE Conference on Sensors*, 2006, pp. 1297-1300.

Abdolvand et al., "Single-Resonator Dual-Frequency Thin-Film Piezoelectric-on-Substrate Oscillator", *IEEE International Electron Devices Meeting*, 2007, pp. 419-422.

Ho et al., "High Order Composite Bulk Acoustic Resonators," *Proc. 20th IEEE International Conference on Micro Electro Mechanical Systems* (MEMS '07), Kobe, Japan, Jan. 2007, pp. 791-794.

Ho et al., "Temperature Compensated IBAR Reference Oscillators," *Proc. 19th IEEE International Conference on Micro Electro Mechanical System*,(MEMS '06), Istanbul, Turkey, Jan. 2006, pp. 910-913.

Baborowski et al., "Piezoelectrically Activated Silicon Resonators", IEEE Frequency Control Symposium, 2007 Joint with the 21st European Frequency and Time Forum, May 1, 2007, pp. 1210-1213, XP031138158, section I.

Casinovi et al., "Analytical Modeling and Numerical Simulation of Capacitive Silicon Bulk Acoustic Resonators," IEEE International Conference on Micro Electro Mechanical Systems, Jan. 2009, pp. 935-938.

Dubois, Marc-Alexandre., "Thin film bulk acoustic wave resonators: a technology overview," MEMSWAVE 03, Toulouse, France, Jul. 2-4, 2003.

Jaakkola et al., "Piezoelectrically transduced Single-Crystal-Silicon Plate Resonators," VTT Technical Research Centre of Finland, Finland.

Kim et al., "Temperature Dependence of Quality Factor in MEMS Resonators," Journal of Microelectromechanical Systems, vol. 17, No. 3, Jun. 2008, pp. 755-766.

Kim et al., "Micromechanical Resonant Displacement Gain Stages," IEEE, 2009, pp. 19-22.

Luoto et al., "MEMS on cavity-SOI wafers," Solid State Electronics 51:328-332 (2007).

Nam et al., "Piezoelectric Properties of Aluminum Nitride for Thin Film Bulk Acoustic Wave Resonator," J. Korean Physical Society, 47:S309-S312 (2005).

Pourkamali et al., "Low-impedance VHF and UHF Capacitive Silicon Bulk Acoustic Wave Resonators—Part I: Concept and Fabrication," IEEE Transaction on Electron Devices, vol. 54, No. 8, Aug. 2007, pp. 2017-2023.

Schoen et al., "Temperature Compensation in Silicon-Based Micro-Electromechanical Resonators", IEEE Conference on Micro Electromechanical Systems 2009, Jan. 25, 2009, pp. 884-887, XP031444436, figures 1-3.

Invitation to Pay Additional Fees and, Where Applicable, Protest Fee, PCT/US2010/022510, Jun. 4, 2010.

Lin et al., "Series-Resonant VHF Micromechanical Resonator Oscillators," *IEEE Journal of Solid-State Circuits*, vol. 39, No. 12, Dec. 2004, pp. 2477-2491.

Notification of Transmittal of the International Search Report and the Written Opinion of the International Searching Authority, or the Declaration; International Search Report; Written Opinion of the International Searching Authority, PCT Application No. PCT/US2008/010844, Jun. 24, 2009.

Schodowski, "Resonator Self-Temperature-Sensing Using A Dual-Harmonic-Mode Crystal Oscillator," *Proc. of the 43rd Annual Symposium on Frequency Control*, Jun. 1989, pp. 2-7.

Sundaresan et al., "A Low Phase Noise 100MHz Silicon BAW Reference Oscillator," *Proc. IEEE Custom Integrated Circuits Conference*, Sep. 2006, pp. 841-844.

Vig, "Dual-mode Oscillators for Clocks and Sensors," *Procs. IEEE Ultrasonics Symposium*, vol. 2, No., 1999, pp. 859-868.

\* cited by examiner

THIN-FILM BULK ACOUSTIC RESONATORS HAVING PERFORATED RESONATOR BODY SUPPORTS THAT ENHANCE QUALITY FACTOR

CROSS-REFERENCE TO RELATED APPLICATION

This application is related to U.S. application Ser. No. 12/393,566, filed Feb. 26, 2009, the disclosure of which is hereby incorporated herein by reference.

FIELD OF THE INVENTION

The present invention relates to integrated circuit devices and, more particularly, to micro-electromechanical devices and methods of forming same.

BACKGROUND OF THE INVENTION

The quality factor (Q) of a mechanical resonator is defined as the energy stored in the resonator divided by the energy dissipated per vibration cycle. This means the lower the energy loss, the higher the quality factor. Various loss mechanisms will contribute to energy dissipation within a thin-film bulk acoustic resonator, including anchor loss, surface loss, air damping and thermoplastic damping. For a thin-film piezoelectric-on-substrate (TPoS) resonator, the loss mechanisms can be from the surface loss associated with the electrode and the piezoelectric layers, the energy dissipated from the resonator to the supporting substrate, and the air damping loss when the device is operated in air.

Anchor loss or support damping is one of the significant energy loss mechanisms. While the resonator vibrates, the harmonic load excites acoustic waves propagating in support beams, which anchor the resonator to its surrounding substrate, and part of the vibration energy is dissipated through elastic wave propagation into the surrounding substrate. One technique to reduce this "anchor" loss includes placing support beams at nodal points where minimum vibration or displacement is present. An example of this technique is disclosed in article by R. Abdolvand et al., entitled "A Low-Voltage Temperature-Stable Micromechanical Piezoelectric Oscillator," Proceedings of the 14$^{th}$ International Conference on Solid-State Sensors, Actuators and Microsystems, Lyon, France, Jun. 10-14 (2007), pp. 53-56.

SUMMARY OF THE INVENTION

Micro-electromechanical acoustic resonators according to some embodiments of the present invention include a substrate having a cavity therein and a resonator body suspended over the cavity. The resonator body is anchored on opposing sides thereof (by support beams) to first and second portions of the substrate. These first and second portions of the substrate, which extend over the cavity as first and second ledges, respectively, each have at least one perforation therein disposed over the cavity. These perforations may be open or filled. In particular, according to some of the embodiments of the invention, the first and second ledges are formed of a first material (e.g., silicon) and the first and second ledges are filled with a second material having a relatively high acoustic impedance relative to the first material. This second material may include a material selected from a group consisting of tungsten (W), copper (Cu), molybdenum (Mo), for example.

According to additional embodiments of the invention, the resonator body may be patterned to have at least one perforation therein, which is disposed over the cavity. In some of these embodiments, a center of the at least one perforation in the resonator body and the centers of the perforations in the first and second ledges may be collinear. In other embodiments of the invention, the at least one perforation in the resonator body and the perforations in the first and second ledges may be aligned to a nodal line of the resonator body when the resonator body is operating at a resonant frequency.

According to additional embodiments of the invention, a method of forming a micro-electromechanical acoustic resonator includes forming a first substrate having a cavity therein extending adjacent a first surface thereof and forming a second substrate having a resonator body layer thereon containing first and second perforations extending through the resonator body layer. A first surface of the resonator body layer is bonded to the first surface of the first substrate so that the first and second perforations are exposed to the cavity. After bonding, the resonator body layer is selectively etched to define a resonator body suspended over the cavity.

According to some of these embodiments of the present invention, forming the first substrate may include forming a first electrically insulating layer on a first surface of a first semiconductor wafer and then selectively etching the first electrically insulating layer and the first semiconductor wafer in sequence to define the cavity within the first semiconductor wafer. The step of bonding may also include bonding a first surface of the resonator body layer to the first electrically insulating layer. In addition, forming a second substrate may include forming a second electrically insulating layer on a first surface of a second semiconductor wafer and forming a resonator body layer on the second electrically insulating layer. A first surface of the resonator body layer is selectively etched to define first and second perforations extending therethrough. Moreover, the step of selectively etching through the resonator body layer may be preceded by planarizing the second semiconductor wafer for a sufficient duration to expose the second electrically insulating layer and then removing the second electrically insulating layer to expose a second surface of the resonator body layer. A piezoelectric layer and one or more electrode layers may also be formed on the second surface of the resonator body layer.

According to additional embodiments of the invention, methods of forming a micro-electromechanical acoustic resonator may include forming a first substrate having a cavity therein extending adjacent a first surface thereof and forming a second substrate having a resonator body layer thereon. A first surface of the resonator body layer is bonded to the first surface of the first substrate. The resonator body layer is then selectively etched to define a resonator body anchored on opposing sides thereof to first and second portions of the resonator body layer that extend over the cavity as first and second ledges and define first and second perforations in the first and second ledges, respectively.

According to still further embodiments of the present invention, a micromachined frequency-selective component includes a coupled-array thin-film piezoelectric-on-substrate (TPoS) resonator device having N resonators therein, where N is an integer greater than one. This resonator includes a resonator body anchored on opposing sides thereof to first and second portions of a substrate that extend over a cavity in the substrate as first and second ledges, respectively. The first and second ledges each have N perforations therein disposed over the cavity. In particular, the resonator body may be anchored to the first and second ledges by N pairs of support beams. The N perforations in the first ledge may be aligned to the N support beams extending between the first ledge and the resonator body, and the N perforations in the second ledge may be aligned to the N support beams extending between the second ledge and the resonator body.

DESCRIPTION OF PREFERRED EMBODIMENTS

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the present invention are described herein with reference to cross-section and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a sharp angle may be somewhat rounded due to manufacturing techniques/tolerances.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1A:
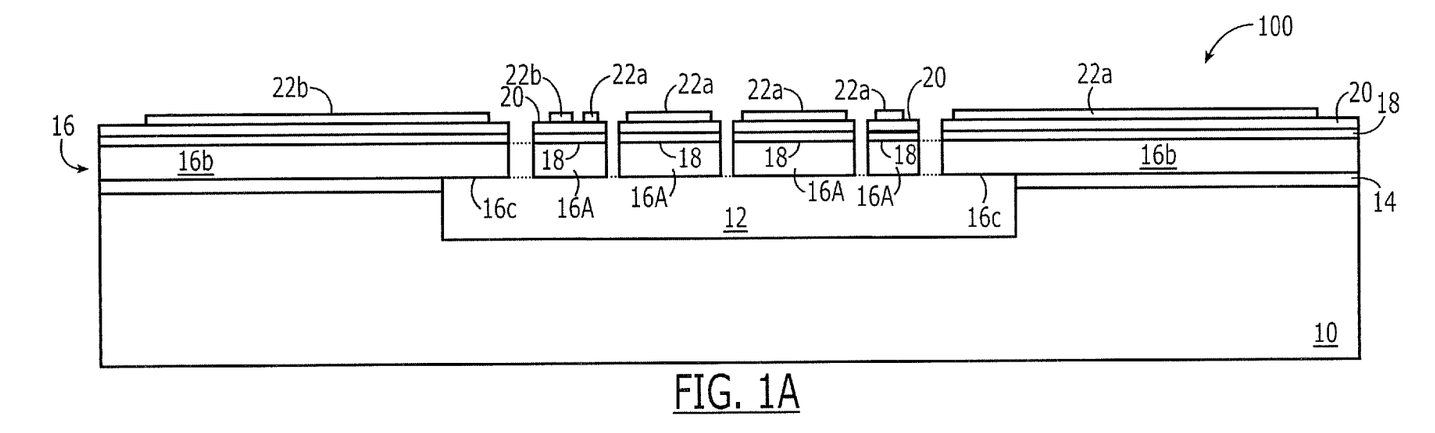
FIG. 1A is a cross-sectional view of an acoustic resonator according to some embodiments of the present invention.
Figure 1B:
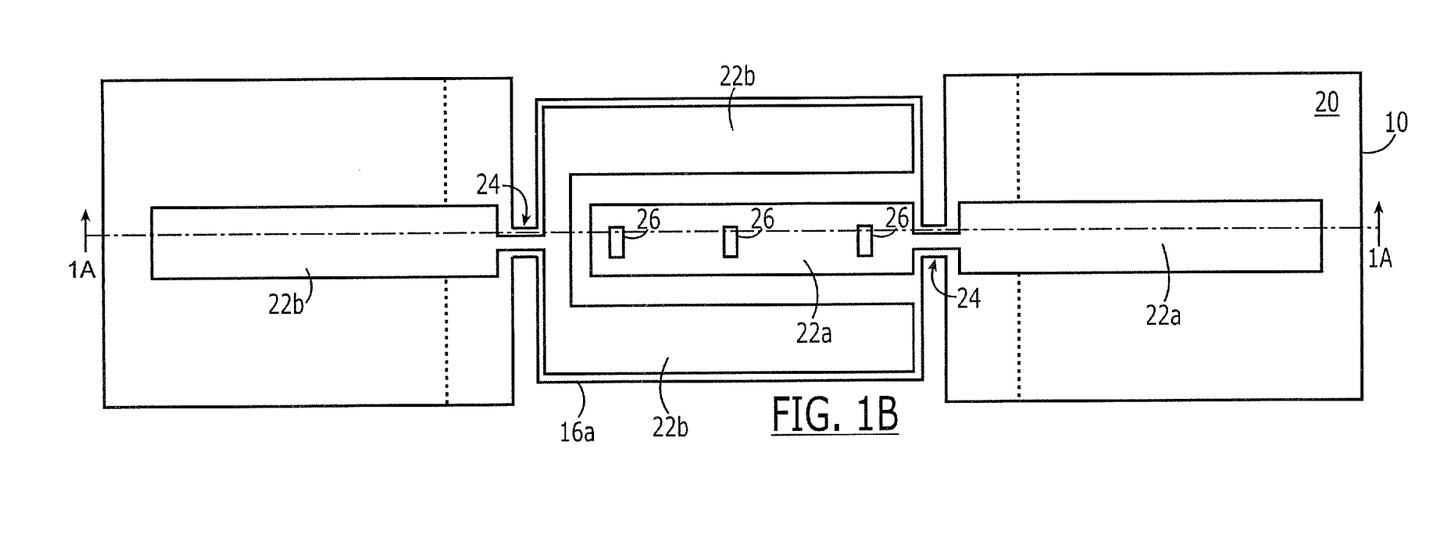
FIG. 1B is a plan view of the resonator of FIG. 1A, taken along line 1A.

FIGS. 1A-1B illustrate a micro-electromechanical acoustic resonator 100 according to a first embodiment of the present invention. This resonator 100 includes a substrate 10 (e.g., silicon substrate) having a cavity 12 therein. A first electrically insulating layer 14 (e.g., silicon dioxide) is formed on a primary surface of the substrate 10 and a resonator body layer 16 is formed on the first electrically insulating layer 14. The resonator body layer 16 (e.g., silicon layer), first electrically insulating layer 14 and substrate 10 may collectively define a semiconductor-on-insulator (SOI) substrate. A bottom electrode layer 18 (e.g., Mo, Al), a piezoelectric layer 20 (e.g., AlN) and an upper electrode layer (e.g., Mo, Al) are formed on the resonator body layer 16. As illustrated, the upper electrode layer is patterned to define a first electrode 22a and a second electrode 22b. The resonator body layer 16 is also patterned to define a suspended resonator body 16a having a plurality of perforations 26 (optional) therein, which is anchored by support beams 24 to surrounding portions 16b of the resonator body layer 16. As illustrated, the surrounding portions 16b of the resonator body layer 16 include first and second portions that extend over the cavity as first and second ledges 16c, respectively. Improvements to resonator performance achieved by the presence of perforations 26 in the resonator body 16a are more fully described in U.S. application Ser. No. 12/393,566, filed Feb. 26, 2009, entitled "Thin-Film Bulk Acoustic Resonators Having Perforated Bodies That Provide Reduced Susceptibility To Process-Induced Lateral Dimension Variations," the disclosure of which is hereby incorporated herein by reference. One of these improvements in resonator performance is higher Q-factor, which can be achieved by spacing the perforations in the resonator body 16a at multiples of λ/4, where λ is a wavelength associated with a resonant frequency of the resonator.

Figure 2A:
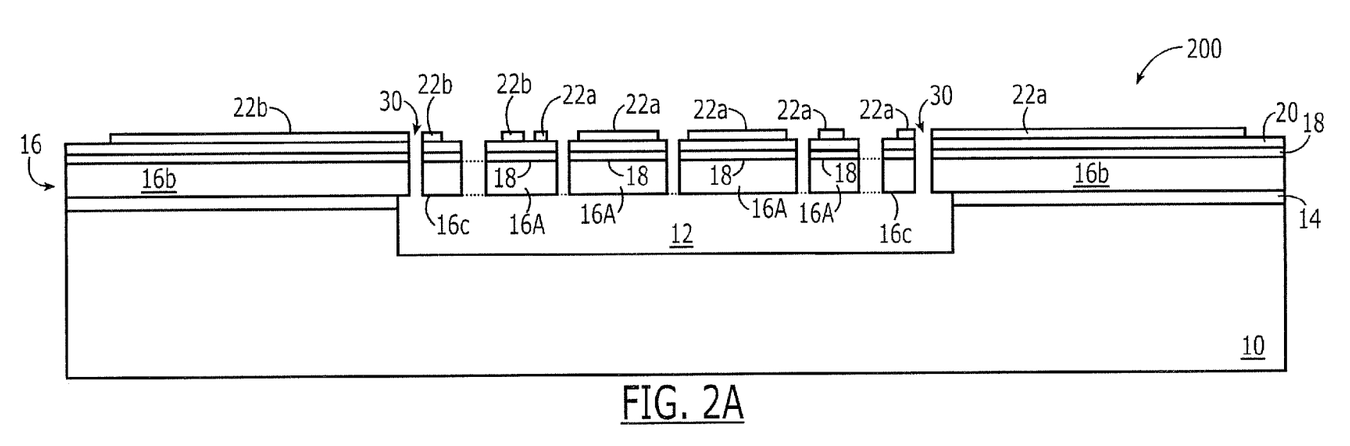
FIG. 2A is a cross-sectional view of an acoustic resonator according to some embodiments of the present invention.
Figure 2B:
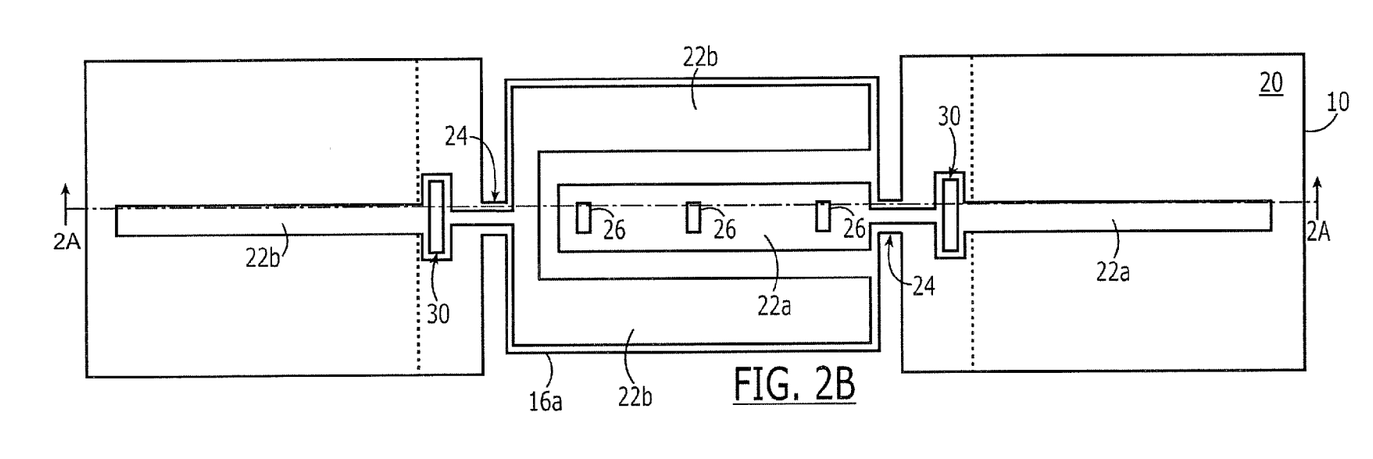
FIG. 2B is a plan view of the resonator of FIG. 2A, taken along line 2A.
Figure 3A:
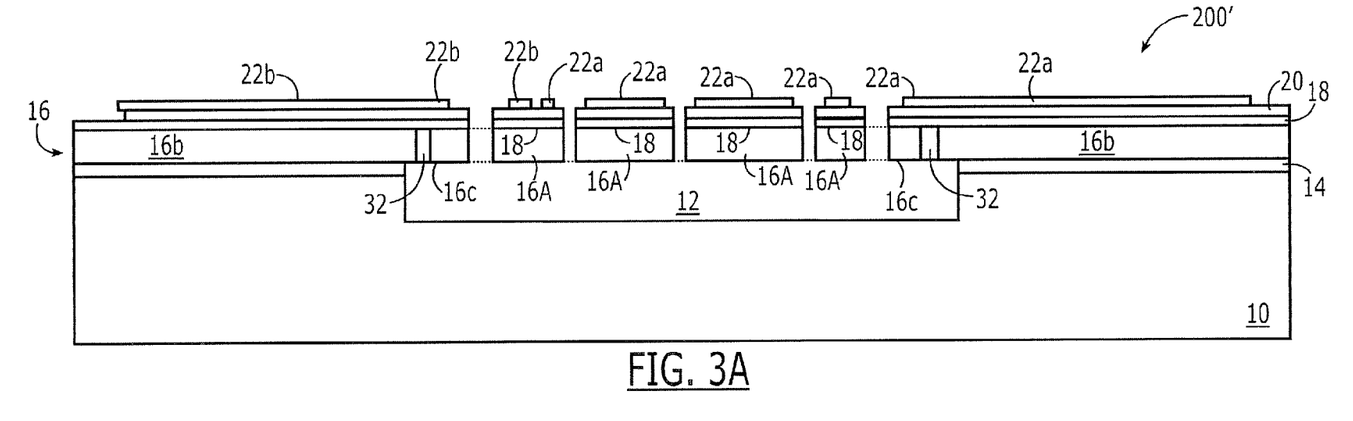
FIG. 3A is a cross-sectional view of an acoustic resonator according to some embodiments of the present invention.
Figure 3B:
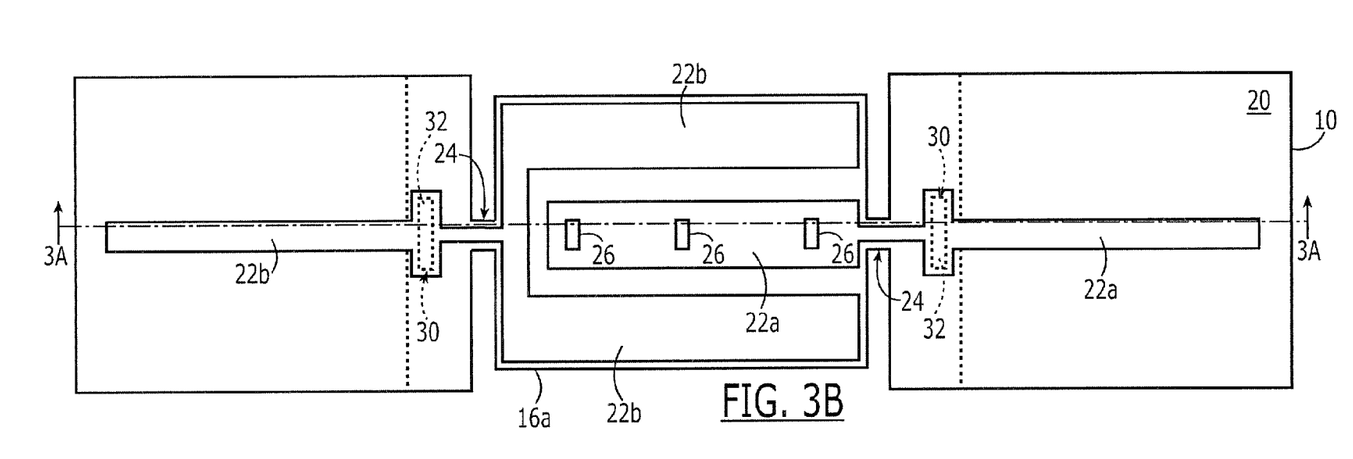
FIG. 3B is a plan view of the resonator of FIG. 3A, taken along line 3A.

FIGS. 2A-2B illustrate a micro-electromechanical acoustic resonator 200 according to a second embodiment of the present invention. This resonator 200 is similar to the resonator 100 of FIG. 1, however, each of the first and second ledges 16c is further provided with a perforation 30 therein in order to increase the quality (Q) of the resonator 200 by reducing the amount of energy transferred from the suspended resonator body 16a to the surrounding portions 16b of the resonator body layer 16 during each vibration cycle. As illustrated, these perforations 30, which extend closely adjacent respective support beams 24, may have centers that are collinear with the centers of the perforations 26. More preferably, the perforation(s) 26 in the resonator body 16a and the perforations 30 in the first and second ledges 16c are aligned to a nodal line of the resonator body 16a when the resonator body is operating at a resonant frequency. Referring now to FIGS. 3A-3B, the performance of the micro-electromechanical acoustic resonator 200 of FIGS. 2A-2B may be alternatively enhanced by filling the perforations 30 with a material 32 (e.g., tungsten (W), copper (Cu) or molybdenum (Mo)) having a relatively high acoustic impedance relative to the surrounding material (e.g., silicon) of the resonator body layer 16.

Figure 4A:
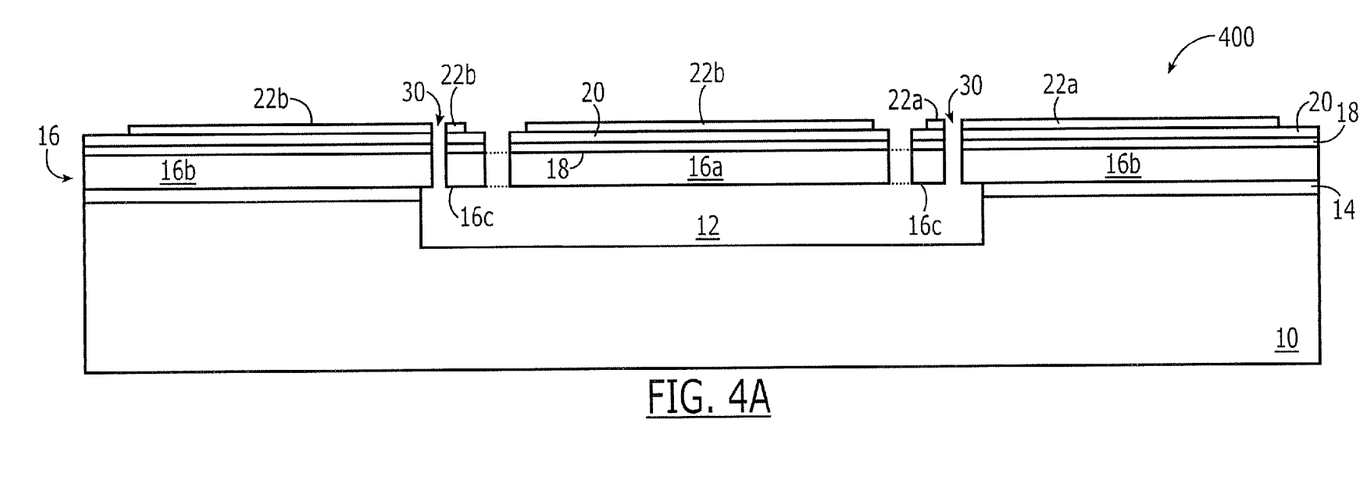
FIG. 4A is a cross-sectional view of an acoustic resonator according to some embodiments of the present invention.
Figure 4B:
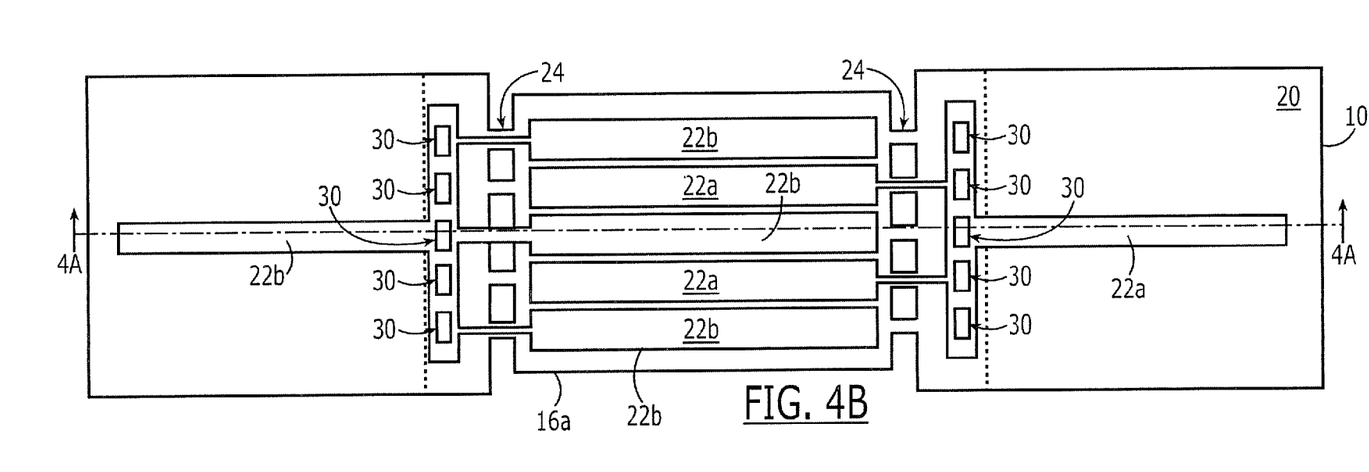
FIG. 4B is a plan view of the resonator of FIG. 4A, taken along line 4A.
Figure 5A:
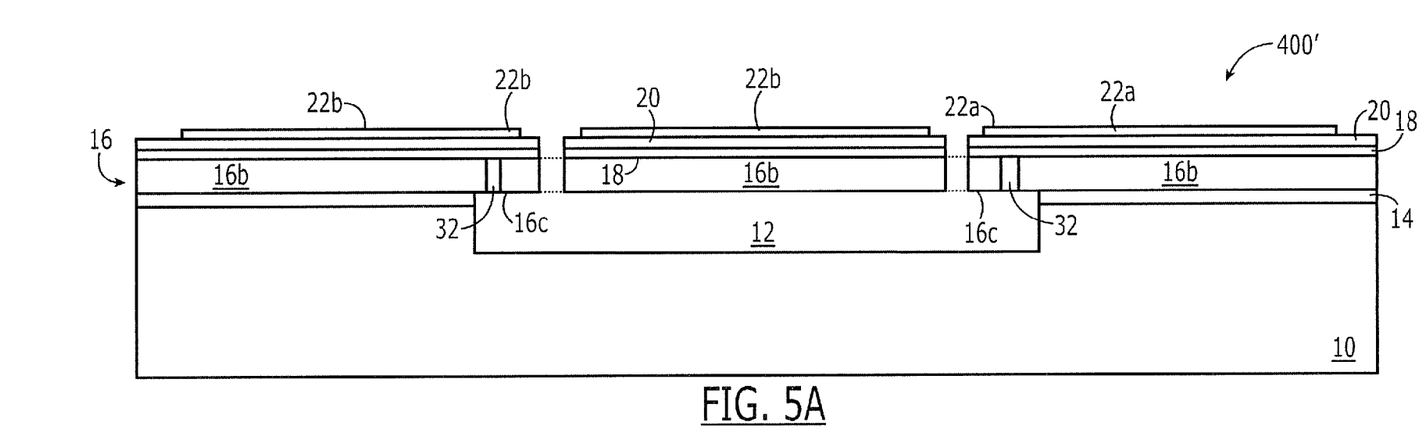
FIG. 5A is a cross-sectional view of an acoustic resonator according to some embodiments of the present invention.
Figure 5B:
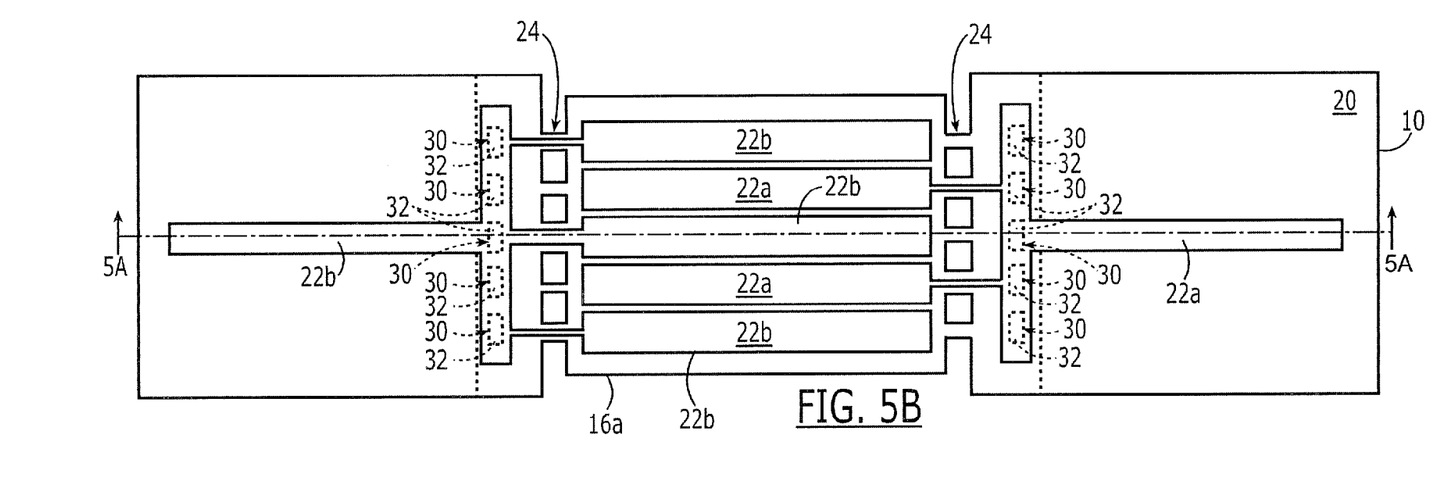
FIG. 5B is a plan view of the resonator of FIG. 5A, taken along line 5A.

FIGS. 4A-4B illustrate a coupled-array thin-film piezoelectric-on-substrate (TPoS) resonator device 400 having N>1 resonators therein, which may be utilized within a micromachined frequency-selective component. This resonator device 400 includes a resonator body 16a anchored on opposing sides thereof to first and second portions of a resonator body layer 16 that extend over a cavity 12 in the substrate 10 as first and second ledges 16c, respectively. Each of these ledges 16 is illustrated as including a plurality of Q-enhancing perforations 30 therein, which are disposed over the cavity 12. The anchoring of the resonator body 16a to the surrounding resonator body layer 16 is provided by N pairs of support beams 24, where N=5. In alternative embodiments of the invention (not shown), the number of support beams attaching the resonator body 16a to the first ledge 16c (e.g., left or right ledge) may be greater than or less than the number of support beams attaching the resonator body 16a to the second opposing ledge 16c. As illustrated by the resonator device 400' of FIGS. 5A-5B, an alternative enhancement in the Q-factor of the resonator device can be achieved by filling the perforations 30 with a material 32 having a relatively perforations 30 with a material 32 having a relatively high acoustic impedance compared to the material of the resonator body layer 16.

Figure 6A:
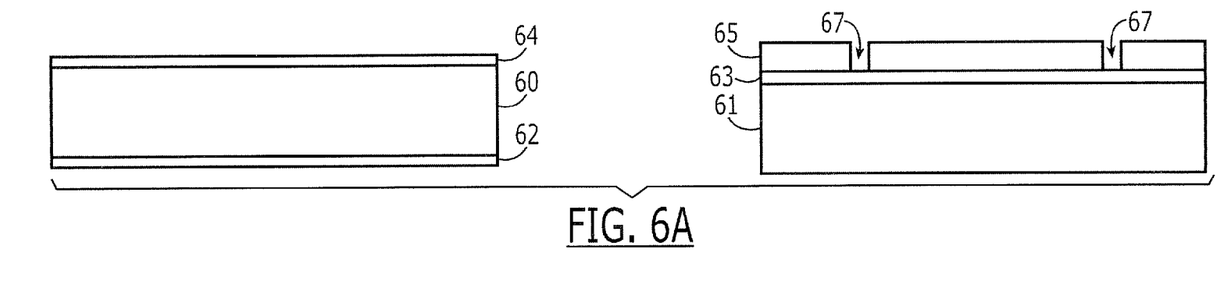
FIGS. 6A-6F are cross-sectional views of intermediate structures that illustrate methods of forming micro-electromechanical acoustic resonators according to embodiments of the present invention.

FIGS. 6A-6G are cross-sectional views of intermediate structures that illustrate methods of forming micro-electromechanical acoustic resonators according to embodiments of the present invention. As illustrated by FIG. 6A, a first semiconductor wafer 60 may be thermally oxidized to define a first and second insulating layers 62 and 64 thereon and a silicon-on-insulator substrate may be formed containing a second semiconductor wafer 61, a third insulating layer 63 on a primary surface of the second semiconductor wafer 61 and a single crystal silicon layer 65 on the third insulating layer 63. The single crystal silicon layer 65 is selectively patterned to define perforations 67 therein.

Figure 6B:
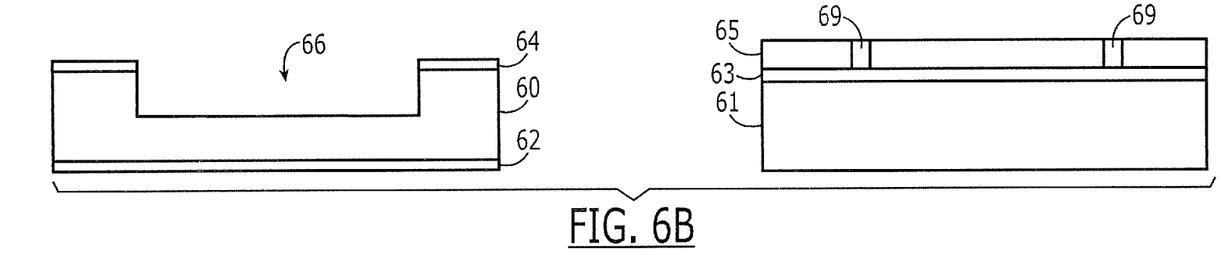

Referring now to FIG. 6B, the second insulating layer 64 may be selectively patterned to define an opening therein and then a selective etching step is performed to define a cavity 66 in the first semiconductor wafer 60. The perforations 67 in the single crystal silicon layer 65 are also filled with a material 69 having a relatively high acoustic impedance relative to the surrounding single crystal silicon. This material 69 may be selected from a group consisting of tungsten (W), copper (Cu) or molybdenum (Mo), however, other materials may also be used.

Figure 6C:
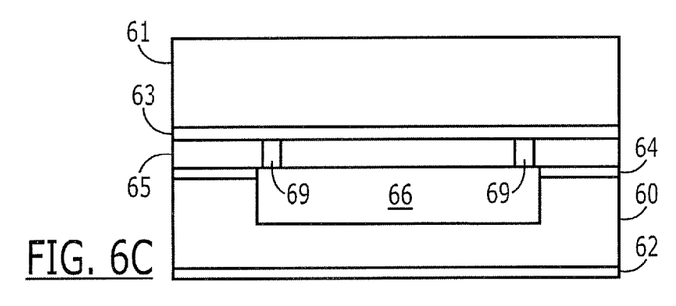
Figure 6D:
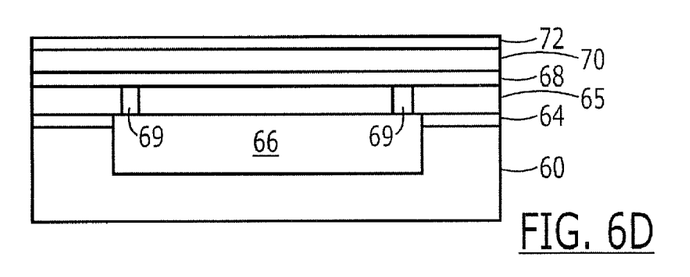
Figure 6E:
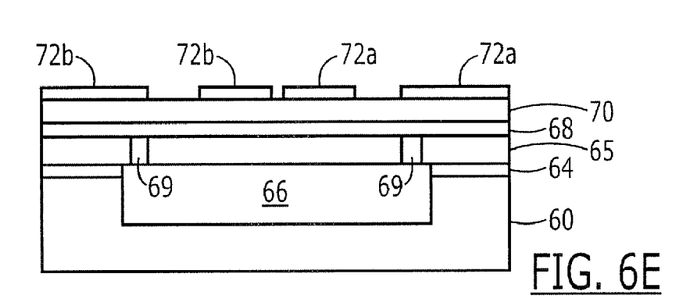
Figure 6F:
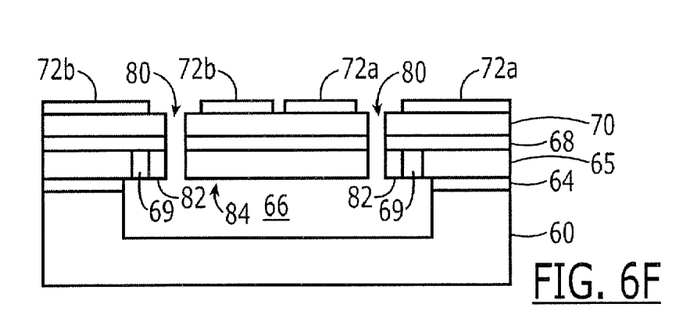

Then, as illustrated by FIG. 6C, the silicon layer 65 is bonded to the second insulating layer 64 to enclose the cavity 66 underneath the silicon layer 65 and expose the material 69 in the perforations 67 to the cavity 66. Conventional planarization techniques may then be performed to remove the second semiconductor wafer 61 and the third insulating layer 63 and thereby expose the single crystal silicon layer 65. Thereafter, as illustrated by FIGS. 6D-6E, a sequence of deposition steps are performed to define a stack of layers including a bottom electrode layer 68, a piezoelectric layer 70 and an upper electrode layer 72. The upper electrode layer 72 is then patterned to define a plurality of electrodes 72a and 72b. Referring now to FIG. 6F, the piezoelectric layer 70, the bottom electrode layer 68 and the single crystal silicon layer 65 are selectively etched to define a suspended resonator body 84 and ledges 82 over the cavity 66, in a manner similar to resonator cross-sections of FIGS. 1B-5B.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A micro-electromechanical acoustic resonator, comprising:
   a substrate having a cavity therein; and
   a resonator body suspended over the cavity, said resonator body anchored on opposing sides thereof to first and second portions of said substrate that extend over the cavity as first and second ledges of a first material, respectively, said first and second ledges each having at least one perforation therein, which is disposed over the cavity and filled with a second material having a relatively high acoustic impedance relative to the first material.

2. The resonator of claim 1, wherein the second material comprises a material selected from a group consisting of tungsten (W), copper (Cu), molybdenum (Mo).

3. The resonator of claim 1, wherein said resonator body has a perforation therein disposed over the cavity.

4. The resonator of claim 3, wherein a center of the perforation in said resonator body and centers of the perforations in the first and second ledges are collinear.

5. The resonator of claim 3, wherein the perforation in said resonator body and respective perforations in the first and second ledges are aligned to a nodal line of said resonator body when said resonator body is operating at a resonant frequency.

6. The resonator of claim 1, wherein said first and second ledges have first and second perforations therein, respectively; wherein the first and second perforations are aligned to a nodal line of said resonator body when said resonator body is operating at a resonant frequency; wherein a shape of the first perforation is symmetric about a first axis that is orthogonal to the nodal line and collinear with a centerline of the first perforation; and wherein a shape of the second perforation is symmetric about a second axis that is orthogonal to the nodal line and collinear with a centerline of the second perforation.

7. The resonator of claim 1, wherein at least one of said first and second ledges has a plurality of perforations therein that are filled with the second material to thereby define alternating regions of unequal acoustic impedance within the at least one of said first and second ledges.

8. A micro-electromechanical acoustic resonator, comprising:

a substrate having a cavity therein; and a resonator body suspended over the cavity, said resonator body anchored on opposing sides thereof to first and second portions of said substrate that extend over the cavity as first and second ledges of a first material, respectively, said first and second ledges each having at least one perforation therein, which is disposed over the cavity and filled with a second material having a different acoustic impedance relative to the first material.

9. The resonator of claim 8, wherein at least one of said first and second ledges has a plurality of perforations therein that are filled with the second material to thereby define alternating regions of unequal acoustic impedance within the at least one of said first and second ledges.

* * * * *